United States Patent
Sakayori

(10) Patent No.: US 7,175,736 B2
(45) Date of Patent: Feb. 13, 2007

(54) LAMINATE FOR ELECTRONIC CIRCUIT

(75) Inventor: Katsuya Sakayori, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 229 days.

(21) Appl. No.: 10/765,086

(22) Filed: Jan. 28, 2004

(65) Prior Publication Data

US 2004/0241465 A1    Dec. 2, 2004

Related U.S. Application Data

(62) Division of application No. 09/835,080, filed on Apr. 16, 2001, now abandoned.

(30) Foreign Application Priority Data

Apr. 20, 2000    (JP) .............................. 2000-119418

(51) Int. Cl.
*B32B 37/00*    (2006.01)
(52) U.S. Cl. .................... 156/309.6; 156/299; 428/458
(58) Field of Classification Search .............. 156/309.6
See application file for complete search history.

(56) References Cited

U.S. PATENT DOCUMENTS 5,741,598 A    4/1998    Shiotani et al. ............. 428/458

FOREIGN PATENT DOCUMENTS

EP    605112 A2 *    7/1994
JP    60102630 A *    6/1985

OTHER PUBLICATIONS

English abstract for JP60102630.*

* cited by examiner

*Primary Examiner*—Jeff H. Aftergut
*Assistant Examiner*—John L. Goff
(74) *Attorney, Agent, or Firm*—Oliff & Berridge, PLC

(57) ABSTRACT

The present invention is directed to a laminate having a layer construction of metal-insulating layer-metal or a layer construction of metal-insulating layer, which laminate meets conditions for developing large adhesive strength between the insulating layer and the metal, as well as to an insulating film and an electronic circuit using the laminate. The laminate has a layer construction of first metal layer/insulating layer/second metal layer or a layer construction of metal layer/insulating layer. The insulating layer 1 has a multilayer structure of two or more layers. The layers on the side of the adhesive interface with each metal layer (a copper foil 3 and an SUS foil 4), out of the layers constituting the insulating layer 1, each are a thermoplastic resin layer 2. The minimum value of the storage modulus at a temperature at or above Tg of the thermoplastic resin layer 2 is not more than $10^6$ Pa.

3 Claims, 4 Drawing Sheets

LAMINATE FOR ELECTRONIC CIRCUIT

This is a Division of application Ser. No. 09/835,080 filed Apr. 16, 2001 now abandoned.

TECHNICAL FIELD

The present invention relates to a laminate having a layer construction of metal-insulating layer-metal and/or a layer construction of metal-insulating layer, and a film consisting of only an insulating layer having a multilayer structure of two or more layers, and a substrate for use mainly in the formation of a circuit on an electronic component, particularly on an insulating layer, by taking advantage of the insulating properties of the laminate.

BACKGROUND ART

In recent years, rapid development of semiconductor technology has led to rapid progress of a reduction in size of semiconductor packages, the adoption of multipin, the adoption of fine pitch, minimization of electronic components and the like. That is, the semiconductor field has entered the so-called "age of high density packaging." Regarding printed wiring boards, this has also led to a change from single side wiring to double side wiring and, in addition, the adoption of a multilayer structure and a thickness reduction (Iwata and Harazono, "Denshi Zairyo (Electronic Material)," 35 (10), 53 (1996)).

Pattern formation methods used in the formation of such wiring and circuits include: a method which comprises the steps of: etching a metal, provided on a substrate having a layer construction of metal-insulating layer-metal, with an acidic solution, such as a ferric chloride solution, to form wirings, then subjecting the insulating layer, for example, to plasma etching, wet etching, or laser etching, to remove the insulating layer to form a desired shape, and connecting the wirings to each other, for example, through plating or electrically conductive paste; and a method (Proceedings of the 7th Symposium of Japan Institute of Electronics Packaging) which comprises the steps of: providing an insulating layer in a desired form using a photosensitive polyimide (Japanese Patent Laid-Open No. 168441/1992) or the like; and then plating gaps to form wiring.

A tendency toward downsizing of electric products in recent years has led to a reduction in thickness of each layer constituting metal conductor layer-polymeric insulating layer, and these layers each are in many cases used in a thickness of not more than 100 μm. When wiring has been formed of such thin layer, a warpage disadvantageously takes place in wiring due to a difference in coefficient of thermal expansion between the metal conductor layer and the polymeric insulating layer. Further, in the case of metal conductor layer-polymeric insulating layer-metal conductor layer, the formation of a circuit formation pattern or the like renders the area of the upper metal conductor layer different from the area of the lower metal conductor layer, and, in this case, here again a warpage takes place in wiring.

When the thermal properties of the insulating layer and the conductor layer are known, the warpage of this substrate can be calculated according to the following equation (Miyaaki and Miki, NITTO TECHNICAL REPORT, 35 (3), 1 (1997)).

$$\sigma = \frac{31 E_1 E_2}{2h(E_1^2 + 14 E_1 E_2^2)} \Delta \alpha \Delta T$$

wherein
E1: modulus of the metal,
E2: modulus of the insulating layer,
$\Delta \alpha$: difference in coefficient of thermal expansion between the metal and the insulating layer,
$\Delta T$: temperature difference, and
h: layer thickness 1: wiring length.

According to this equation, the following two methods are considered effective for reducing the warpage of wiring:
1. a reduction in modulus of insulating layer; and
2. a reduction in the difference in coefficient of thermal expansion between the insulating layer and the metal wiring layer.

Regarding the wiring formation method, in the substrate used in the method for the formation of wiring through etching of a metal in the laminate having layer construction of metal-insulating layer-metal or a layer construction of metal-insulating layer, in order to reduce the warpage of the substrate, a low-expansion polyimide is used as the insulating layer from the viewpoint of the necessity of rendering the coefficient of thermal expansion of the metal identical to the coefficient of thermal expansion of the insulating layer (U.S. Pat. No. 4,543,295, Japanese Patent Laid-Open Nos. 18426/1980 and 25267/1977). Since, however, the low-expansion polyimide is not generally thermoplastic, the adhesion to metals is poor making it difficult to provide adhesive strength high enough to withstand practical use. To overcome this problem, a thermoplastic polyimide resin or epoxy resin having good adhesion to the metal is used as an adhesive layer between the metal and the low-expansion polyimide.

At the present time, rapid expansion of production of personal computers has lead to increased production of hard disks incorporated in the personal computers. A component, in the hard disk, called a "suspension," which supports a head for reading magnetism, is being shifted in its main products from one, wherein copper wiring is connected to a stainless steel plate spring, to one called a "wireless suspension" comprising copper wiring which has been connected directly to a stainless steel plate spring, from the viewpoint of coping with the size reduction.

The wireless suspension is mainly formed of a material having a three-layer structure. The material has a layer construction comprising an insulating layer, a copper alloy foil provided on one side of the insulating layer, and a stainless steel foil provided on the other side of the insulating layer. Since scanning on a disk being rotated at a high speed is carried out, fine vibration is applied to the member. Therefore, the adhesive strength of the wiring is very important. This requires satisfying severe specifications. The adhesive strength of the wiring depends greatly upon the material having a three-layer structure in its adhesive layer portion, and the ability of the adhesive layer as such determines the adhesive strength as the product.

A polyimide or similar resin, which has good insulating properties even in a thin layer thickness, is used as the resin for the insulating layer in the laminate having a layer construction of metal-insulating layer-metal or a layer construction of metal-insulating layer, particularly in the field of electronic members where long-term reliability is required. In order to impart adhesive properties to the polyimide resin, it is common practice to impart thermoplasticity. However, there is few specific studies on the relationship between the adhesive strength of the polyimide resin and the properties of adhesives. The present situation is, for example, such that, when the adhesive strength of the polyimide resin is examined, actual contact bonding followed by a peel test is necessary, that is, very troublesome work should be carried out.

DISCLOSURE OF THE INVENTION

Accordingly, it is an object of the present invention to provide a laminate having a layer construction of metal-insulating layer-metal or a layer construction of metal-insulating layer, which laminate meets conditions for developing large adhesive strength between the insulating layer and the metal, as well as to provide an insulating film and an electronic circuit using the laminate.

In order to solve the above problems of the prior art, the present inventor has made extensive and intensive studies on the properties and adhesive strength of the polyimide resin. As a result, the present inventor has found that the influence of the viscoelastic behavior at the contact bonding temperature on the adhesive strength is much more significant than that of the composition of the resin on the adhesive strength. This has led to the completion of the present invention.

Maximizing the anchor effect created by biting of the resin into concaves and convexes on the surface of an adherend is considered contributable to enhanced adhesive strength. To this end, the contact bonding is preferably carried out at a temperature of Tg, in which the thermoplastic resin beings to develop fluidity, or above. In this case, however, the storage modulus at a temperature of Tg or above varies according to a difference in structure of the resin. Therefore, even in the case of contact bonding at a temperature of Tg (glass transition point) or above, the created adhesive strength varies depending upon the structure of the resin. The present inventor has directed attention to storage modulus as a measure of the fluidity of the resin and has made studies on the relationship between the storage modulus and the adhesive strength for thermoplastic resins having various different compositions. As a result, the present inventor has found a correlation such that the adhesive properties improve with lowering the storage modulus at a temperature at or above Tg. The present inventor has further found that resins particularly having a storage modulus of not more than $10^6$ Pa have good adhesion to adherends independently of resin composition.

These demonstrate that the use of thermoplastic resins having a storage modulus of not more than $10^6$ Pa at a temperature at or above Tg can provide laminates having good adhesive strength. More preferably, the storage modulus in the range of $10^6$ Pa to $10^2$ Pa can provide laminates having better adhesive strength. The storage modulus of not less than $10^6$ Pa at a temperature at or above Tg is unfavorable. The reason for this is that the fluidity is low at the time of contact bonding in the preparation of the laminate and, thus, the resin is less likely to bite into the concaves and convexes on the surface of the adherend and this makes it difficult to develop anchor effect. On the other hand, the storage modulus of not more than $10^2$ Pa at a temperature at or above Tg poses a problem such that, although the adhesive property can be exhibited, the fluidity of the adhesive layer is excessively large and, consequently, the adhesive layer is squeezed out from the bonded surface in the step of contact bonding in the preparation of the laminate.

Thus, according to one aspect of the present invention, there is provided a laminate having a layer construction of first metal layer-insulating layer-second metal layer or a layer construction of metal layer-insulating layer, wherein said insulating layer has a multilayer structure of two or more layers, the layer on the side of the adhesive interface with the metal layer, out of the layers constituting the insulating layer, is a thermoplastic resin layer, and the minimum value of the storage modulus at a temperature at or above Tg of the thermoplastic resin layer is not more than $10^6$ Pa.

BEST MODE FOR CARRYING OUT THE INVENTION

Figure 1:
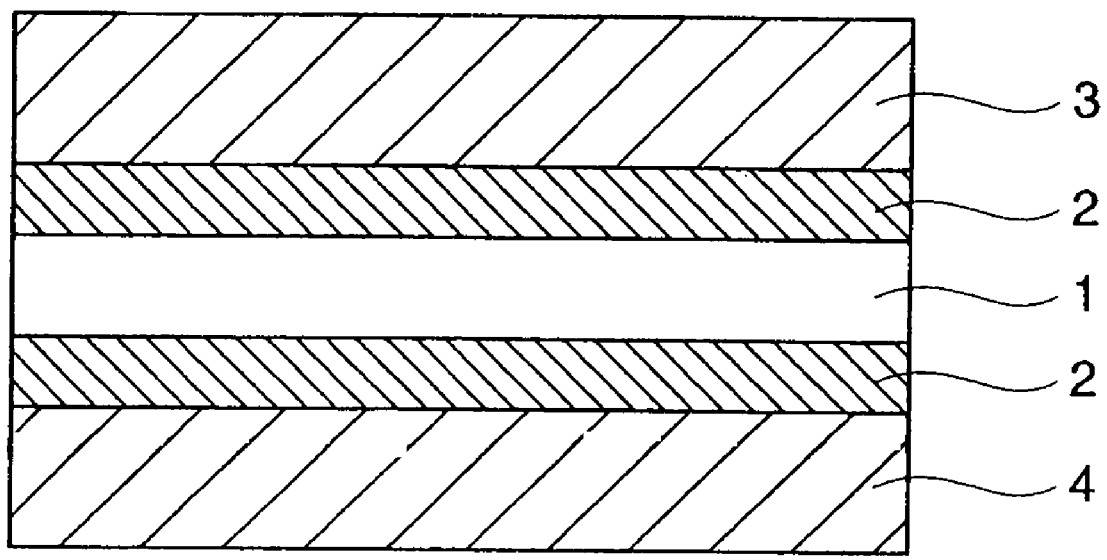
FIG. 1 is a diagram showing one embodiment of the layer construction of the laminate according to the present invention.
Figure 2A:
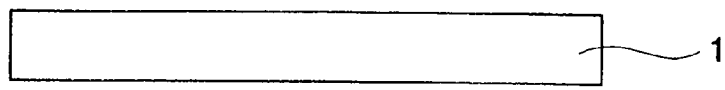
FIGS. 2A to 2D are diagrams showing one embodiment of a flow sheet of the production process of a laminate according to the present invention.
Figure 2B:
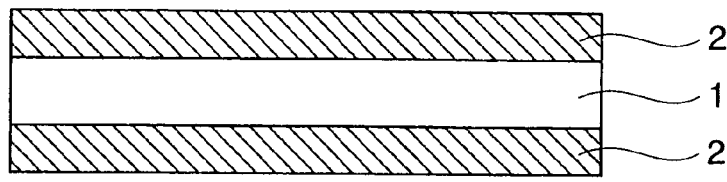
Figure 2C:
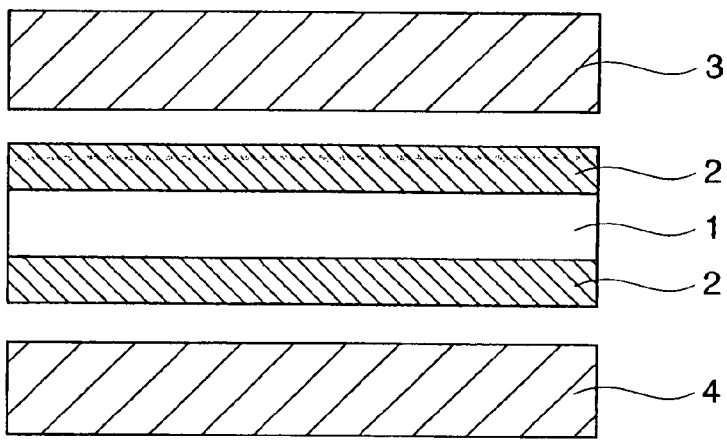
Figure 2D:
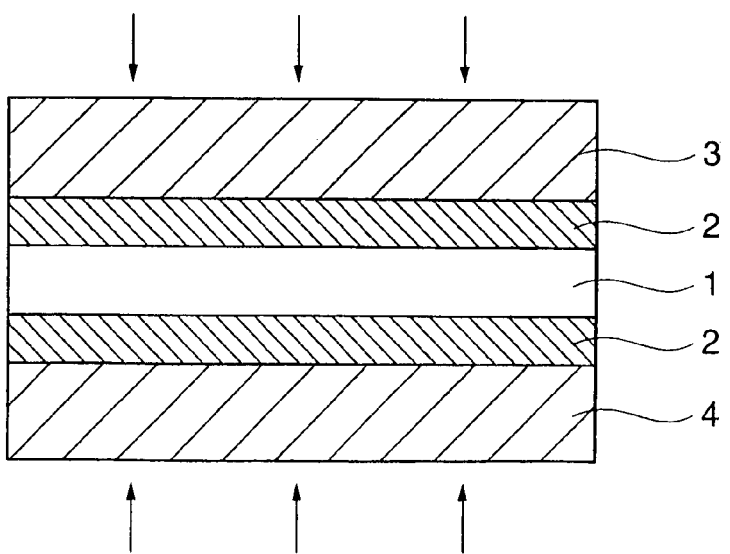
Figure 3A:
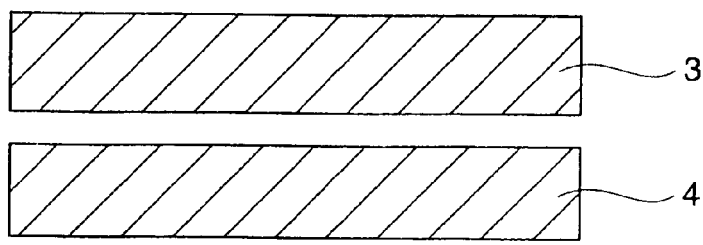
FIGS. 3A to 3D are diagrams showing another embodiment of a flow sheet of the production process of a laminate according to the present invention.
Figure 3B:
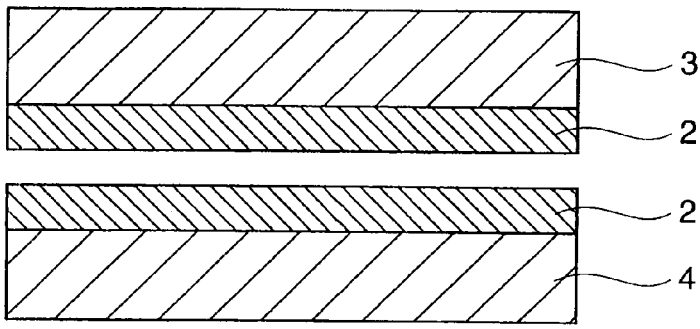
Figure 3C:
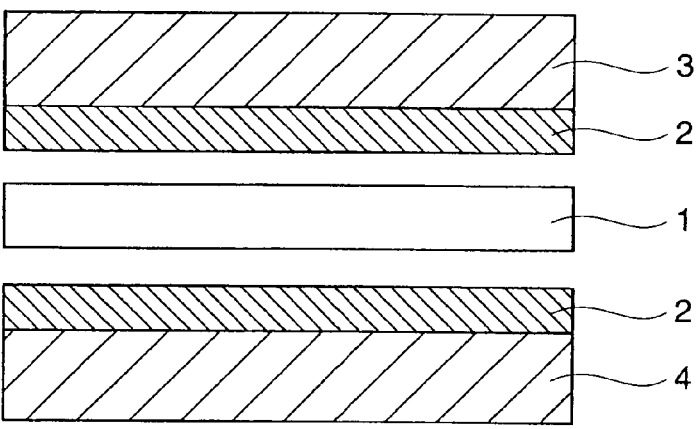
Figure 3D:
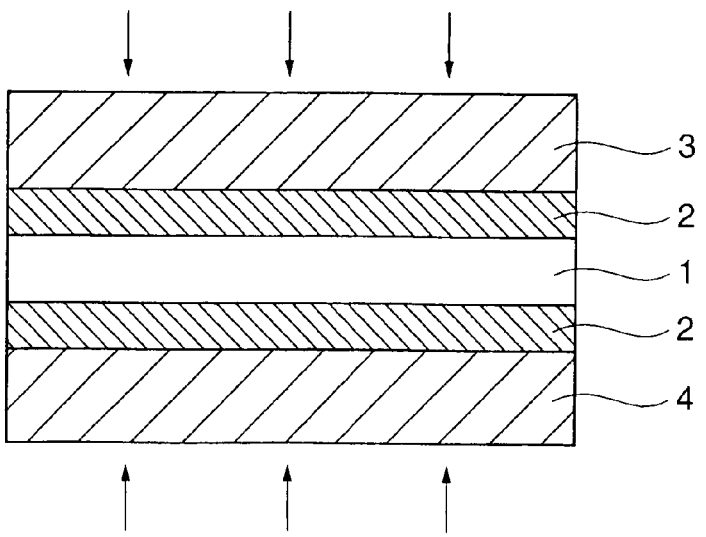

The present invention will be explained in detail.

The adhesive strength between the adhesive and the metal is mainly determined by two factors, one of which is the affinity of the molecular structure of the adhesive for the surface of the metal and the formation of a bond with the metal and the other is the anchor effect attained by biting of the adhesive into concaves and convexes on the surface of the metal.

The affinity for the surface of the metal embraces generally considerable affinity and bond, such as chemical bond or coordination bond to the surface of the metal and intermolecular interaction (interaction between atoms).

As a result of extensive and intensive studies, the present inventor has found that the adhesive strength at the interface of the metal and adhesive bonded by contact bonding is influenced more significantly by the anchor effect than the bond between the molecular structure and the metal and the affinity, and has also found the relationship between the properties of the fluidity of the adhesive layer and the adhesive strength.

It is generally said that, when a resin having higher fluidity is used as an adhesive, the anchor effect is more likely to occur. In fact, however, there is no report about detailed studies on the fluidity of the adhesive layer, and the principle of the present invention is very useful for the preparation of laminates having good adhesive strength.

Metals or films as the adherend are not particularly limited. However, adherends having certain concaves and convexes formed, for example, by hydrophobilization of the surface are likely to develop adhesive strength by the anchor effect. In this case, it should be noted that when the thickness of the adhesive layer is lower than the height of the concaves and convexes of the adherend, a space is formed between the adherend and the adhesive layer, leading to lowered adhesive strength.

Thermoplastic Resin

According to the present invention, the insulating layer on the side of the adhesive interface with the metal layer is formed of a thermoplastic resin. Polyimides, which have low coefficient of thermal expansion and are highly heat resistant, or resins having properties similar to the polyimides are preferred as the insulating layer from the viewpoint of the necessity of rendering the coefficient of thermal expansion of the metal identical to that of the insulating layer. The term "thermoplastic resin" as used herein refers to resins having a clear glass transition point. The resin, however, is not particularly limited and is independently of the presence or absence of the imide bond, so far as the resin has heat resistance and insulating property. Thermoplastic resins preferably usable in the present invention include, but are not particularly limited to, resins having an imide bond in the molecule thereof, such as polyimides, polyamide-imides, polyether-imides, and maleimide-modified resins, and resins having a relatively high glass transition point, such as aromatic polyesters and aromatic polyamides.

There is a tendency of a correlation such that the adhesive strength increases with lowering the storage modulus at a temperature at or above Tg of the thermoplastic resin. The preparation of resins so as to lower the storage modulus generally results in a tendency toward the formation of thermoplastic resins having lower Tg.

The term "storage modulus" as used herein refers to the storage modulus of the thermoplastic resin as the adhesive at the time of bonding between the insulating layer and the adherend, for example, by contact bonding. In this connection, it should be noted that, in some cases, the state of the material having a three layer structure as the final form is different from the state of the bonding step, for example, in molecular structure due to heat history. Therefore, the storage modulus does not refer to the storage modulus in the changed state.

In general, the weight average molecular weight of the thermoplastic resin according to the present invention is preferably 6000 to 500000, particularly preferably 8000 to 80000, although the weight average molecular weight varies depending upon the molecular structure. When the molecular weight is not less than 500000, it is difficult to provide homogeneous coating. Further, the larger the storage modulus at a temperature at or above Tg, the lower the fluidity and the lower the tendency of the attainment of the anchor effect. In general, in the case of resins having the same chemical composition, the lower the molecular weight, the lower the Tg (glass transition point) and the lower the storage modulus at a temperature at or above Tg. When the molecular weight is not more than 6000, the film forming property is poor making it difficult to provide a homogeneous coating of a thermoplastic resin layer.

The thermoplastic resin as the adhesive may be coated in a solution form, or alternatively may be applied by a different method, for example, in a film form. Further, a method may also be used which comprises applying a precursor or a derivative of the thermoplastic resin, performing molding and then processing the molded product to convert the chemical structure to a desired chemical structure.

Laminate

FIG. 1 shows one embodiment of the layer construction of the laminate according to the present invention. Numeral 1 designates an insulating layer. A thermoplastic resin layer 2 is stacked on both sides of the insulating layer 1. A copper foil 3 or an alloy foil is stacked as a metal layer on one of the thermoplastic resin layers 2, and an SUS foil (a stainless steel foil) 4 is stacked as a metal layer on the other thermoplastic resin layer 2.

At least one layer constituting the insulating layer may be formed of a polyimide resin or may be a polyimide film. Alternatively, all the layers constituting the insulating layer may be formed of a polyimide resin or may be a polyimide film.

Each metal layer is preferably formed of a material selected from the group consisting of copper alloy, copper, and stainless steel. The first metal layer may be formed of a material which is the same as or different from that constituting the second metal layer.

Insulating Film

An insulating film comprising a resin film or a resin layer as an insulating layer and a thermoplastic resin layer, having a minimum value of storage modulus of not more than $10^6$ Pa at a temperature at or above Tg, provided on both sides or one side of the insulating layer may be used as an intermediate material for the production of the laminate according to the present invention. At least one resin layer constituting the insulating layer may be a polyimide film or may be formed of a polyimide resin. Alternatively, all the layers constituting the insulating layer may be formed of a polyimide resin or may be a polyimide film.

Production Process of Laminate

A film coating process and a metal coating process will be described as a production process of a laminate having layer construction of first metal layer-insulating layer-second metal layer as an example of the laminate composed of a metal layer and an insulating layer. The production process is not particularly limited to these only. The production process of the laminate according to the present invention will be described by taking, as an example, the use of a polyimide film as an insulating layer.

1) Film Coating Process

FIG. 2 is an embodiment of a flow sheet showing a production process of the laminate according to the present invention. According to this embodiment, as shown in FIGS. 2A to 2D, a polyimide film is provided as an insulating layer 1 (FIG. 2A). A thermoplastic polyimide solution is coated on both sides of the polyimide film, and the coated polyimide film is dried to remove the solvent to form a thermoplastic resin layer 2 as an adhesive layer (FIG. 2B). Next, as shown in FIG. 2C, a copper foil 3 and an SUS foil (a stainless steel foil) 4 are brought into intimate contact with respective both sides of the polyimide film through the respective thermoplastic resin layers 2, that is, the copper foil 3 is formed on one of the thermoplastic resin layers 2, while the SUS foil 4 is formed on the other thermoplastic resin layer 2. Thereafter, as shown in FIG. 2D, thermocompression bonding is carried out at a temperature at or above the softening point (Tg) of polyimide in the thermoplastic resin layer 2 while applying high pressure.

2) Metal Coating Process

FIG. 3 is another embodiment of a flow sheet showing a production process of the laminate according to the present invention. As shown in FIGS. 3A to 3D, a copper foil 3 and an SUS foil (a stainless steel foil) 4 are provided (FIG. 3A). A polyimide solution is coated on one side of each of the copper foil 3 and the SUS foil 4, and the coated copper foil 3 and the coated SUS foil 4 are dried to remove the solvent to form a thermoplastic resin layer 2 on the copper foil 3 and on the SUS foil 4 (FIG. 3B). A polyimide film as an insulating layer 1 is sandwiched between the copper foil 3 with the thermoplastic resin layer 2 formed thereon and the SUS foil (stainless steel foil) 4 with the thermoplastic resin layer 2 formed thereon so that the thermoplastic resin layers 2 face each other, followed by intimate contact (FIG. 3C). Thereafter, thermocompression bonding is carried out at a temperature at or above the softening point (Tg) of the thermoplastic resin layer 2 while applying high pressure (FIG. 3D).

For each coating process, the thermocompression bonding is preferably carried out at a temperature such that exhibits the minimum value of the storage modulus of the thermoplastic resin. This is because the fluidity of the thermoplastic resin is best and the anchor effect attained by biting of the thermoplastic resin into the concaves and convexes on the surface of the adherend is maximized to enhance the adhesive strength between the metal layer and the core insulating layer.

Electronic Circuit

An electronic circuit can be generally formed by the following method.

At the outset, a photosensitive resin layer is coated or laminated on the surface of a metal on its side where the formation of a circuit is desired. A mask with a desired pattern image formed thereon is brought into intimate contact with the photosensitive resin layer, followed by exposure to an electromagnetic wave with wavelength to which the photosensitive resin is sensitive. Thereafter, when the photosensitive resin is of a positive-working type, the exposed area is developed with a predetermined developing solution. On the other hand, when the photosensitive resin is of a negative-working type, the unexposed area is eluted with a predetermined developing solution. Thus, a desired circuit image is formed on the metal. The metal with the circuit image formed thereon is then immersed in a solution capable of dissolving the metal, such as an aqueous ferric chloride solution. Alternatively, this solution may be sprayed on the substrate. Thus, the metal exposed on the surface is eluted, and the photosensitive resin is then peeled off by a predetermined peeling solution to form a circuit.

When etching of the insulating layer is necessary, a desired pattern may be formed on the circuit prepared in the above manner, followed by patterning of the insulating layer by a dry or wet process.

EXAMPLES

Dynamic Viscoelastic Test

Resins, i.e., polyamic acid varnish [PAA-A (tradename) manufactured by Mitsui Chemicals Inc.] as a precursor-type polyimide; polyamide-imide varnish [N 8020 (tradename) manufactured by Toyobo Co., Ltd.] as a polyamide-imide; and polyimide varnish [SN-20 (tradename), PN-20 (tradename), and EN-20 (tradename) manufactured by New Japan Chemical Co., Ltd.] as solvent-soluble, ring-closing-type polyimide, were used in a dynamic viscoelastic test. Metal foils, i.e., a rolled copper foil [18 μm (layer thickness), RCF-T5B (tradename) manufactured by FUKUDA METAL FOIL & POWDER CORPORATION] and a stainless steel foil [20 μm (layer thickness), SUS 304 H-TA foil (tradename) manufactured by Nippon Steel Corp.], were provided as a substrate and used in an adhesive property test. Further, a polyimide film [75 μm (layer thickness), APIKAL NPI film (tradename) manufactured by Kanegafuchi Chemical Ind. Co., Ltd.] was used for studies on adhesion to the resins.

Each resin was coated on each substrate having a size of 10 cm×10 cm and a layer thickness of 12 μm, and all the coated substrates except for PAA-A (tradename) were dried in an oven at 180° C. for 30 min. For PAA-A (tradename) which is an amic acid varnish, the solvent was removed by drying at 120° C. for 15 min, and the coated substrate was then subjected to a predetermined procedure to perform thermal imidation, thereby preparing a polyimide. After the formation of the coating in a thickness of about 20 μm, etching of the substrates was carried out in 45 Baume ferric chloride having a liquid temperature of 50° C. to prepare coating substrates. These coating substrates were taken off to obtain test pieces having a size of about 1.5 cm in length×5 mm in width. These coating substrates were measured for storage modulus at each temperature by means of a viscoelastic measuring apparatus RSA-II (tradename) manufactured by Rheometric Scientific under conditions of sample length 8 mm, sample width 5 mm, temperature rise rate 5° C./min, frequency 3.0 Hz, and temperature rise from room temperature to 400° C.

Evaluation of Adhesive Property

Concaves and convexes were intentionally provided on the surface of the substrate so that separation does not take place between the adhesive layer and the substrate and interfacial peeling between the adherend and the adhesive layer or cohesive failure of the adhesive layer necessarily takes place. The surface of a 100 μm-thick SUS 304 plate was roughened by means of a wet blasting machine manufactured by MACOHO using #1000 alumina as an abrasive under conditions of pressure 0.7 kg/cm$^2$ and scanning speed 10 mm/sec, and the surface was then ultrasonically washed with pure water for 30 min to remove the abrasive deposited on the surface. In this case, both sides of the plate were roughened because roughening of only one side causes warpage of the SUS 304 plate. Thereafter, a 2 to 3 μm-thick coating was spin coated on the surface, and the coating was dried or imidated under the above-described conditions to form an adhesive layer on the SUS 304 plate. Desired metals and films were stacked on the assemblies, followed by vacuum contact bonding at a temperature, which renders the storage modulus of each sample lowest, at a surface pressure of 1 MPa for 10 min to preape samples. Here the peak of Tanδ as obtained from the measurement of viscoelasticity was regarded as Tg.

The samples were cut with a hand push cutter into a size of 1 cm in width, followed by a 90-degree peel test at a tensile speed of 500 mm/min by means of a material tester (type 5565) manufactured by Instron. The test results on the adhesive property, Tg, and the lowest value of the storage modulus are shown in Table 1.

TABLE 1

| | | | Min. value of storage modulus | Substrate | | |
| --- | --- | --- | --- | --- | --- | --- |
| | | Tg | at temp. of Tg or above | RCF-TSB | SUS 304 H-TA | APIKAL NPI |
| Thermo- | PAA-A | 205° C. | $1.2 \times 10^4$ Pa | 1250 g/cm | 1300 g/cm | 920 g/cm |
| plastic | N 8020 | 315° C. | $1.0 \times 10^8$ Pa | 190 g/cm | 10 g/cm | 270 g/cm |

TABLE 1-continued

|  |  | Tg | Min. value of storage modulus at temp. of Tg or above | RCF-TSB | SUS 304 H-TA | APIKAL NPI |
|---|---|---|---|---|---|---|
| resin | SN-20 | 305° C. | $1.0 \times 10^7$ Pa | 250 g/cm | 70 g/cm | 200 g/cm |
|  | PN-20 | 285° C. | $1.5 \times 10^6$ Pa | 300 g/cm | 200 g/cm | 360 g/cm |
|  | EN-20 | 160° C. | $1.0 \times 10^4$ Pa | 1250 g/cm | 820 g/cm | 1600 g/cm |

Figure 4:
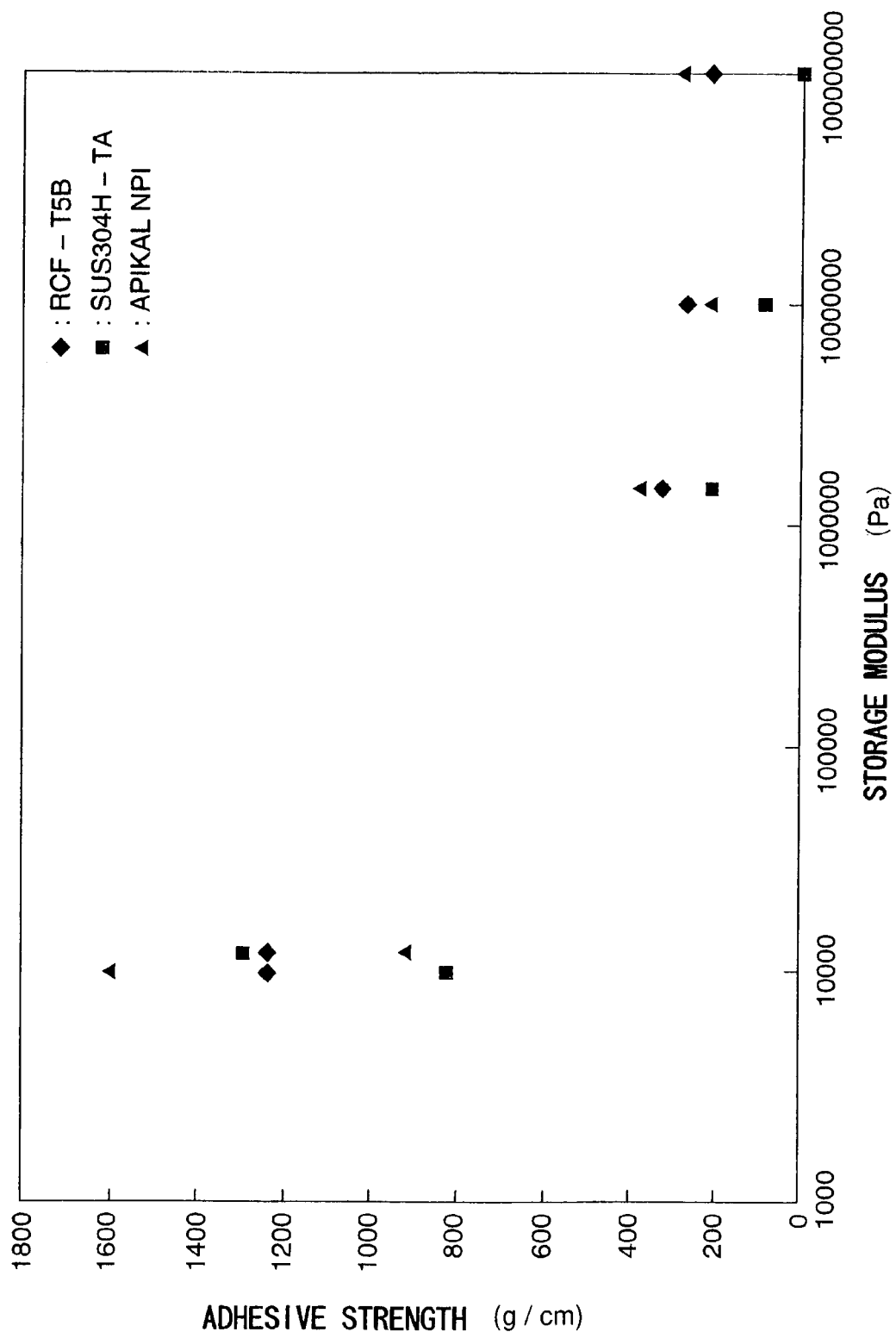
FIG. 4 is a graph showing the relationship between the storage modulus and the adhesive strength (g/cm) based on the results shown in Table 1, wherein the abscissa represents the storage modulus (Pa) and the ordinate the adhesive strength.

FIG. 4 is a graph showing the relationship between the storage modulus and the adhesive strength based on the results shown in Table 1, wherein the abscissa represents the storage modulus (Pa) and the ordinate the adhesive strength. In FIG. 4, ♦ represents data on RCF-T5B foil (tradename) manufactured by FUKUDA METAL FOIL & POWDER CORPORATION, ■ represents data on SUS 304 H-TA foil (tradename) manufactured by Nippon Steel Corp., and ▲ represents data on APIKAL NPI film (tradename) manufactured by Kanegafuchi Chemical Ind. Co., Ltd. As is apparent from the graph shown in FIG. 4, lower storage modulus at temperatures of Tg or above provides better adhesion to each substrate.

Production of Laminate

An APIKAL NPI film (tradename, manufactured by Kanegafuchi Chemical Ind. Co., Ltd.) having a thickness of 12.5 μm (layer thickness) was applied as a polyimide core film to a 100 μm thick SUS 304 plate. A thermoplastic polyimide varnish EN-20 manufactured by New Japan Chemical Co., Ltd. was spin coated on one side of the polyimide film applied onto the substrate to a final layer thickness of about 2 μm, and the coating was dried at 180° C. for 30 min in the air to remove the solvent. Thereafter, the film was separated from the substrate, and the substrate was turned over. The film was again applied to the substrate, and an adhesive layer was formed in the same manner as described above. The film with an adhesive layer formed on both sides thereof was sandwiched between a 20 μm thick SUS 304 HTA and a rolled copper foil RCF-T5B manufactured by FUKUDA METAL FOIL & POWDER CORPORATION (thickness 18 μm), and vacuum contact bonding was carried out under conditions of 300° C., 1 MPa, and 10 min.

For various samples, laminates were prepared in the same manner as described above, and circuits were formed by the following method. The temperature, at which contact bonding to the laminate was carried out, was the temperature at which the lowest storage modulus was provided in the dynamic viscoelasticity test, and the pressure and the time were 1 MPa and 10 min for all the cases. For the polyamic acid varnish [PAA-A (tradename) manufactured by Mitsui Chemicals Inc.] which is a precursor varnish, a tack-free precursor layer was formed on both sides of the film, and the polyamic acid varnish on both sides of the film was simultaneously thermally imidated by a predetermined method to prepare a film provided with an adhesive layer, followed by stacking.

Circuits were prepared as follows. An assembly composed of SUNFORT AQ 5038 (a negative-working dry film manufactured by Asahi Chemical Industry Co, Ltd.) laminated onto the copper side of the three-layer material was exposed by a contact exposure system through a predetermined mask. The exposed assembly was developed with a 1% aqueous sodium carbonate solution, was immersed in a 45 Baume aqueous ferric chloride solution to remove the exposed copper, and was then immersed in a 3% aqueous sodium hydroxide solution of 50° C. for one min to remove the dry film.

The circuit prepared from the three-layer material had a desired shape.

According to the present invention, the interposition, as an adhesive layer, of a thermoplastic resin having a minimum value of storage modulus of not more than $10^6$ Pa at a temperature at or above Tg of the thermoplastic resin layer at the interface between the metal layer and the insulating layer can provide laminates having good adhesive strength between the metal layer and the insulating layer.

What is claimed is:

1. A process for producing a laminate, comprising the step of thermocompression bonding a core insulating layer, a thermoplastic resin layer, which is disposed on both sides or one side (z-plane) of the core insulating layer, has an adhesive property and has a maximum value of the storage modulus of not more than $10^6$ Pa at a temperature at or above Tg of the thermoplastic resin layer, and a metal layer disposed on the surface of the thermoplastic resin layer at a temperature of Tg or above of the thermoplastic resin layer under temperature conditions such that the storage modulus of the thermoplastic resin is minimum.

2. A method for producing an electronic circuit comprising the steps of: providing a laminate comprising a combination of a metal layer with an insulating layer, said laminate having a layer construction of first metal layer/insulating layer/second metal layer or a layer construction of metal layer/insulating layer, the insulating layer having a multi-layer structure of two or more layers, the layer on the side of the adhesive interface with the metal layer, out of the layers constituting the insulating layer, being a thermoplastic resin layer, and a maximum value of the storage modulus at a temperature at or above Tg of the thermoplastic resin layer being not more than $10^6$ Pa and obtained by thermocompression under temperature conditions such that the storage modulus of the thermoplastic resin is minimum; forming a photosensitive resin layer on a surface of the metal layer of the laminate; and patterning the thus formed photosensitive resin layer to prepare an electronic circuit.

3. A method for producing an electronic circuit comprising the steps of: providing an insulating film comprising an insulating layer and a thermoplastic resin layer provided on at least one side of the insulating layer, the thermoplastic resin having a maximum value of the storage modulus of not more than $10^6$ Pa at a temperature at or above Tg of the thermoplastic resin layer; laminating the insulating film with a metal layer to prepare a laminate by thermocompression under temperature conditions such that the storage modulus of the thermoplastic resin is minimum; forming a photosensitive resin layer on a surface of the metal layer of the laminate; and patterning the thus formed photosensitive resin layer to prepare an electronic circuit.

* * * * *